United States Patent
De Foucauld

(10) Patent No.: US 10,666,219 B2
(45) Date of Patent: May 26, 2020

(54) AUTOMATIC IMPEDANCE MATCHING METHOD AND MODULE, PARTICULARLY FOR A RADIO-FREQUENCY TRANSMISSION OR RECEPTION CHAIN

(71) Applicant: COMMISSARIAT A L'ENERGIE ATOMIQUE ET AUX ENERGIES ALTERNATIVES, Paris (FR)

(72) Inventor: Emeric De Foucauld, Voiron (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 378 days.

(21) Appl. No.: 14/936,319

(22) Filed: Nov. 9, 2015

(65) Prior Publication Data
US 2016/0142035 A1    May 19, 2016

(30) Foreign Application Priority Data
Nov. 13, 2014  (FR) ..................... 14 60964

(51) Int. Cl.
*H03H 7/40* (2006.01)
*H01Q 1/50* (2006.01)
(Continued)

(52) U.S. Cl.
CPC .............. *H03H 7/40* (2013.01); *H01Q 1/50* (2013.01); *H04B 1/0458* (2013.01); *H04B 1/18* (2013.01)

(58) Field of Classification Search
CPC .......... H03H 7/40; H01Q 1/50; H04B 1/0458; H04B 1/18
(Continued)

(56) References Cited

U.S. PATENT DOCUMENTS

| 4,375,051 A | 2/1983 | Theall |
| 2007/0194859 A1 | 8/2007 | Brobston et al. |

(Continued)

FOREIGN PATENT DOCUMENTS

| EP | 2 037 576 A2 | 3/2009 |
| EP | 2 509 222 A1 | 10/2012 |

(Continued)

OTHER PUBLICATIONS

L. Collot et al., "Reconfigurable Filtering Differential Low Noise Amplifier Using MEMS Tunable Inductor," Proceedings of the 40th European Microwave Conference, Sep. 28-30, 2010, Paris, France, pp. 826-829.

(Continued)

*Primary Examiner* — Samuel S Outten
(74) *Attorney, Agent, or Firm* — Baker & Hostetler LLP

(57) ABSTRACT

An automatic impedance matching method for a radio-frequency chain comprises: an impedance matching network having an input and an output, a first radio-frequency device connected to the input and a second radio-frequency device connected to the output, the impedance matching network exhibiting a reconfigurable topology and comprising a plurality of reactive elements, at least one of which exhibits a variable reactance, the method comprising the choice of the configuration of the impedance matching network allowing the implementation of impedance matching while minimizing losses. An automatic impedance matching module for implementing the method is provided. Radio-frequency transmission and reception chains comprising a module are also provided.

6 Claims, 4 Drawing Sheets

(51) Int. Cl.
*H04B 1/04* (2006.01)
*H04B 1/18* (2006.01)

(58) Field of Classification Search
USPC .................................................. 333/17.3
See application file for complete search history.

(56) References Cited

U.S. PATENT DOCUMENTS

| | | | | |
|---|---|---|---|---|
| 2009/0130991 | A1* | 5/2009 | Rofougaran | H03H 7/38 455/78 |
| 2011/0227666 | A1* | 9/2011 | Manssen | H03H 5/12 333/32 |
| 2013/0069737 | A1* | 3/2013 | See | H04B 1/18 333/32 |
| 2015/0180593 | A1* | 6/2015 | Hamilton | H03F 1/565 455/107 |

FOREIGN PATENT DOCUMENTS

| | | |
|---|---|---|
| EP | 2 509 227 A1 | 10/2012 |
| JP | H08-195684 A | 7/1996 |
| WO | 2011/026858 A1 | 3/2011 |

OTHER PUBLICATIONS

Owen Casha et al., "Utilization of MEMS Tunable Inductors in the design of RF Voltage-Controlled Oscillators," 15th IEEE International Conference on Electronics, Circuits and Systems, 2008, ICECS 2008.

Chen, et al., "Insertion Loss Characterization of Impedance Matching Networks for Low-Power Rectennas", IEEE Transactions on Components, Packaging and Manufacturing Technology, vol. 8, No., Sep. 9, 2018.

Yehui Han et al., "Analysis and Design of High Efficiency Matching Networks," IEEE Transactions on Power Electronics, vol. 21, No. 5, Sep. 2006, pp. 1484-1491.

* cited by examiner

AUTOMATIC IMPEDANCE MATCHING METHOD AND MODULE, PARTICULARLY FOR A RADIO-FREQUENCY TRANSMISSION OR RECEPTION CHAIN

CROSS-REFERENCE TO RELATED APPLICATION

This application claims priority to foreign French patent application No. FR 1460964, filed on Nov. 13, 2014, the disclosure of which is incorporated by reference in its entirety.

FIELD OF THE INVENTION

The invention relates to an automatic impedance matching method for a radio-frequency chain, such as a radio-frequency transmission or reception chain, and more specifically to an automatic antenna matching method. The invention also relates to an automatic impedance matching module allowing the implementation of such a method, and to radio-frequency transmission and reception chains comprising such an automatic impedance matching module.

BACKGROUND

In some radio-frequency information transmission applications, it has been found that the transmission or reception antenna can have an impedance that is highly dependent on conditions outside the antenna, and notably dependent on the environment in which the antenna is placed.

By way of example, in medical telemetry, there may be cause to introduce the antenna into a probe placed in the human body, and the impedance is then highly dependent on the biological environment that contains the antenna. It depends on the electrical properties (conductivity, dielectric constant) of the surrounding tissues (muscles, fat) or of the liquid environment (blood, other liquids) in which the antenna may be immersed.

Even in more conventional radio-frequency transmission applications (mobile telephony, etc.), the impedance of the antenna can vary.

In a general manner, antenna impedance variations are particularly sensitive for antennas of very small dimensions having a high quality coefficient, which are used in applications with high miniaturization constraints.

These impedance variations can cause losses called mismatch losses: these losses result from the fact that the transmission chain that feeds the antenna, or the reception chain that receives a signal from the antenna, is generally designed to have optimum performance levels when it is loaded (at the output for the transmission chain or at the input for the reception chain) with a specific nominal impedance; it has degraded performance levels when it is loaded with an impedance that is different from its nominal value. Mismatch losses can be as much as 40 dB.

For this reason, it is known practice to interpose, between the output of a power amplifier and the antenna of a transmission chain, an impedance matching network that prompts the transmission chain to see a different impedance from that of the antenna and one that is preferably equal to the nominal value for which it has been designed, for example 100 ohms or 500 ohms. The matching network is tunable, that is to say that its, capacitive and/or inductive, elements have adjustable values in order to take account of the environmental conditions of the antenna so that the matching is the best possible whatever the circumstances.

Equally, it is known practice to interpose such an impedance matching network between the antenna of a reception chain and the input of a low-noise amplifier.

Several techniques have been proposed for automatically tuning such a matching network, so as to keep up with, by way of example, variations in the antenna impedance that are caused by outside conditions.

The document U.S. Pat. No. 4,375,051 teaches the use, in a transmission chain, of a bidirectional coupler for detecting a mismatch by measuring the fraction of the power provided by an amplifier that is reflected by the antenna. This measurement serves to servo-control the impedance network in order to modify its configuration in a way that tends to reduce the reflected power. This method suffers from two disadvantages: firstly, the reflected power may be low and subject to parasitic interference, because any interference picked up by the antenna comes to distort the measurement owing to the fact that it is added to the reflective power. Secondly, there is no one-to-one relationship between the quantity of reflected power, which serves as an input for the servo-control, and the complex impedance value with which the matching network would need to be provided in order to really match the amplifier to the antenna. This method therefore leads to a new impedance that is not necessarily optimum, because a plurality of couples of complex impedances correspond to a given power.

Document US 2009/0130991 discloses a method for adjusting the values of the reactances of an impedance matching circuit that is arranged between a reception antenna and a low-noise amplifier in which the reactances of the elements of said matching circuit are iteratively adjusted so as to maximize the intensity of the output signal from said low-noise amplifier. The convergence of the iterative optimization algorithm may be very slow.

The documents EP 2 037 576, WO 2011/026858, EP 2 509 222 and EP 2 509 227 describe various variants of an automatic impedance matching method for a radio-frequency transmission or reception chain, in which current and voltage measurements at the input (for a transmission chain) or at the output (for a reception chain) of the matching network allow the antenna impedance to be determined. The knowledge obtained in this manner about the antenna impedance allows the use of conventional techniques, for example based on a Smith chart, to adjust the impedance values of the elements of the matching network so as to achieve impedance matching.

The document US 2013/0069737 describes an automatic impedance matching method for a radio-frequency transmission or reception chain in which not only the reactance value of certain elements but also the topology of the matching network are modified.

A disadvantage of the automatic matching methods according to the prior art is that they do not take account of the losses introduced by the impedance matching network. These losses originate from the non-ideal behaviour of the reactive elements (capacitors and reactors), the impedance of which exhibits a non-zero resistive component, and in some cases they may be greater than the efficiency benefit provided by the impedance matching.

SUMMARY OF THE INVENTION

The invention aims to overcome the aforementioned disadvantages of the prior art. More particularly, it aims to provide an automatic impedance matching method that allows the losses introduced by the impedance matching network to be taken into account, while being simple to implement and converging rapidly. It also aims to provide an impedance matching module that allows such a method to be implemented.

According to the invention, this aim is achieved by virtue of:
- a matching network exhibiting, besides the variable-reactance elements, a reconfigurable topology; and
- a processor that is configured or programmed to configure said matching network by adjusting the reactance values of said elements and by determining its topology so as to implement impedance matching while minimizing losses.

A object of the invention is therefore an automatic impedance matching method for a radio-frequency chain comprising: an impedance matching network having an input and an output, a first radio-frequency device connected to said input and a second radio-frequency device connected to said output, said impedance matching network exhibiting a reconfigurable topology and comprising a plurality of reactive elements, at least one of which exhibits a variable reactance, the method comprising:
- measurement of at least one current and a voltage at the input or at the output of said impedance matching network;
- determination, by a data processor receiving, as input, the results of said measurements, of a topology of said matching network and of a reactance value of said or of each said reactive element so as to jointly optimize the impedance matching between said first and said second radio-frequency device and the power output of said matching network; and
- configuration of said impedance matching network so that it takes said topology and so that said or each said reactive element exhibiting a variable reactance takes said reactance value.

According to various embodiments:
The method can comprise the following steps:
a) measuring at least one current and a voltage at the input or at the output of said impedance matching network;
b) computing a complex impedance $Z_m$, defined by the ratio between the voltage and the current that are measured by taking account of their phase shift and representing a load impedance of said first radio-frequency device or an input impedance of said second radio-frequency device, depending on whether the measurements in step a) have been taken at the input or at the output of said impedance matching network;
c) from said complex impedance $Z_m$, from the topology and from the known present values of the reactive elements of said impedance matching network, computing the value of a complex impedance $Z_d$ that is representative of an output impedance of said first radio-frequency device or of an input impedance of said second radio-frequency device, depending on whether the measurements in step a) have been taken at the input or at the output of said impedance matching network;
d) for a plurality of possible topologies of said impedance matching network, computing new reactance values for said or for each said reactive element exhibiting a variable reactance, so that said load impedance of said first radio-frequency device or said input impedance of said second radio-frequency device takes a value as close as possible to a predefined nominal value;
e) choosing, from among said topologies of said impedance matching network, the one that minimizes losses when the reactance of said or of each said reactive element exhibiting a variable reactance takes the value computed in step d); and
f) configuring the impedance matching network so that it takes the topology determined in step e) and so that the reactance of said or of each said reactive element exhibiting a variable reactance takes the value computed in step d).

More particularly, the measurements in step a) can be taken at the output of said impedance matching network, the method also comprising the following step, which is implemented after said step f):
g) computing the electrical power at the output of said impedance matching network from the voltage and the current that are measured, and iteratively adjusting the reactance of said or of each said reactive element exhibiting a variable reactance so as to maximize said electrical power.

Said first radio-frequency device may be or comprise a power amplifier and said second radio-frequency device may be or comprise an antenna.

Said first radio-frequency device may be or comprise an antenna and said second radio-frequency device may be or comprise a low-noise amplifier.

Said first radio-frequency device may be or comprise an antenna and said second radio-frequency device may be or comprise a low-noise amplifier, the method also comprising the following step, which is implemented after said step f):
g') measuring the electrical power at the output of said low-noise amplifier, and iteratively adjusting the reactance of said or of each said reactive element exhibiting a variable reactance so as to maximize said electrical power.

Another object of the invention is an automatic impedance matching module that is intended to be arranged between a first radio-frequency device and a second radio-frequency device, said module comprising: an impedance matching network having an input that is intended to be connected to said first radio-frequency device and an output that is intended to be connected to said second radio-frequency device, said impedance matching network comprising a plurality of reactive elements, at least one of which exhibits a variable reactance; a current and voltage measuring device, which is designed to measure a current and a voltage at the input or at the output of said impedance matching network; at least one first configuration device for said impedance matching network, which is capable of modifying the reactance of said or of each said reactive element exhibiting a variable reactance; and a data processor that is configured to receive, as input, current and voltage measurements from said measuring device and to provide, as output, control signals for said first configuration device(s); wherein: said impedance matching network exhibits a reconfigurable topology; the module also comprises at least one second configuration device for said impedance matching network, which is capable of modifying its topology; said data processor is configured to determine a topology of said matching network and a reactance value of said or of each said reactive element so as to jointly optimize the impedance matching between said first and said second radio-frequency device and the power output of said matching network, and to generate control signals for said first and second configuration devices that are adapted so that said devices configure the impedance matching network so that it takes said topology and so that said or each said reactive element exhibiting a variable reactance takes said value.

According to various embodiments:

Said data processor can be configured to: compute a complex impedance $Z_m$, defined by the ratio between the voltage and the current that are measured by said measuring device by taking account of their phase shift and representing a load impedance of said first radio-frequency device or an input impedance of said second radio-frequency device, depending on whether said measuring device is designed to take measurements at the input or at the output of said impedance matching network; from said complex impedance $Z_m$, from the topology and from the known current values of the reactive elements of said impedance matching network, computing the value of a complex impedance $Z_d$ that is representative of an output impedance of said first radio-frequency device or of an input impedance of said second radio-frequency device, depending on whether said measuring device is designed to take measurements at the input or at the output of said impedance matching network; for a plurality of possible topologies of said impedance matching network, computing new reactance values for said or for each said reactive element exhibiting a variable reactance, so that said load impedance of said first radio-frequency device or said input impedance of said second radio-frequency device takes a value as close as possible to a predefined nominal value; choosing, from among said topologies of said impedance matching network, the one that minimizes losses when the reactance of said or of each said reactive element exhibiting a variable reactance takes the computed value; generating control signals for said first and second configuration devices that are adapted so that said devices configure the impedance matching network so that it takes the chosen topology and so that said or each said reactive element exhibiting a variable reactance takes the computed value.

Said data processor can also be configured to receive, as input, an electrical power measurement, or data allowing an electrical power to be computed, and to generate control signals for said first configuration device(s) that are adapted so that said devices iteratively adjust the reactance of said or of each said reactive element exhibiting a variable reactance so as to maximize said electrical power.

Moreover, said data processor can be configured to compute said electrical power from the current and voltage measurements from said measuring device.

As a variant, said impedance matching module can also comprise a power measuring device that is designed to measure an output electrical power from said second radio-frequency device and to provide a measurement result for said data processor.

Yet another object of the invention is a radio-frequency transmission chain comprising a power amplifier, an antenna and an automatic impedance matching module that is connected between an output of said power amplifier and an input port of said antenna.

Yet another object of the invention is a radio-frequency reception chain comprising an antenna, a low-noise amplifier and such an automatic impedance matching module that is connected between an output port of said antenna and an input of said low-noise amplifier.

"Radio-frequency" is understood to mean any frequency between 3 kHz and 300 GHz.

"Power amplifier" is understood to mean an amplifier that has an output connected or intended to be connected, directly or indirectly, to a transmitting antenna.

"Low-noise amplifier" is understood to mean an amplifier that has an output connected or intended to be connected, directly or indirectly, to a receiving antenna.

"Reactive element" is understood to mean an electrical component whose impedance exhibits, at at least one frequency in the radio-frequency realm, a reactive (capacitive or inductive) component greater than or equal—and preferably greater by a factor of 10 or more—to its resistive component.

The "topology" of an electrical network is defined by all of the elements of which it is composed (capacitors, reactors, resistors . . . ) and the interconnection thereof, leaving aside the value of their resistance, inductance or capacitance. It is understood that a plurality of elements of one and the same type that are connected in series or in parallel are considered to constitute a single element. Thus, there is no change of topology in replacing, by way of example, a single capacitor with two capacitors connected in parallel.

The signals in the matching network will subsequently be considered to exhibit a single frequency $f=2\pi\omega$, which allows a capacitive or inductive element (reactive element) to be characterized by a reactance value. This approximation is generally satisfactory in the realm of radio frequencies.

BRIEF DESCRIPTION OF THE DRAWINGS

Other features, details and advantages of the invention will emerge upon reading the description, which is written with reference to the appended drawings, which are provided by way of example and in which, respectively.

DETAILED DESCRIPTION

Figure 1A:
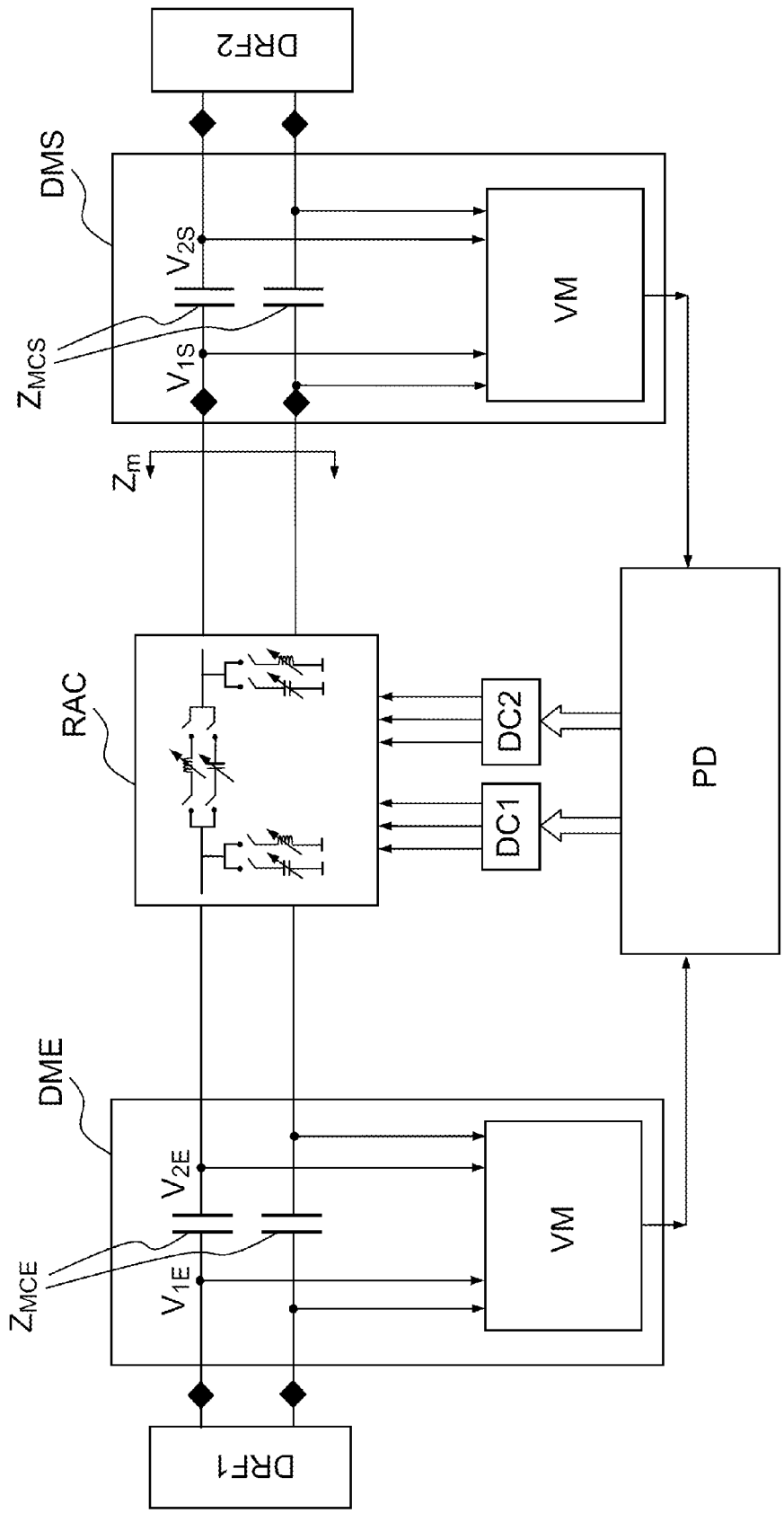
FIG. 1A shows the block diagram of an automatic impedance matching module according to an embodiment of the invention.

FIG. 1A shows the block diagram of an automatic impedance matching module according to an embodiment of the invention, inserted into a radio-frequency chain. The module comprises a configurable impedance matching network RAC having two ports, two measuring devices DME, DMS arranged at said ports (but in fact a single one may suffice), a data processor PD receiving, as input, measurement data generated by said measuring devices and generating control signals for two control devices DC1, DC2 that configure the network RAC. The two ports of the impedance matching network RAC are connected to a first radio-frequency device DRF1 and to a second radio-frequency device DRF2, respectively. In what follows, unless indicated otherwise, the first radio-frequency device DRF1 will be considered to be a power amplifier AP and the second radio-frequency device DRF2 will be considered to be an antenna ANT operating in transmission mode (see FIG. 3), and thus the radio-frequency chain is a transmission chain; filters may also be provided between the amplifier and the impedance matching network and/or between the latter and the antenna. Other cases are also possible, in particular the first radio-frequency device DRF1 may be an antenna ANT operating in reception mode and the second radio-frequency device DRF2 may be a low-noise amplifier ABB, and thus the radio-frequency chain be a reception chain.

In what follows, the electrical power will still be considered to propagate from DRF1 to DRF, so that the measuring device DME is arranged at the input of the impedance matching network and the measuring device DMS is arranged at the output of the latter.

The measuring devices DME, DMS allow measurement of the input and output voltage and current of the matching network, respectively. These devices may notably be of the type described in the aforementioned document EP 2 037 576, and may comprise:
- an impedance $Z_{MCE}$, $Z_{MCS}$ connected in series;
- a device VM allowing measurement of the voltage upstream and downstream of this impedance.

Preferably, the measuring impedances $Z_{MCE}$, $Z_{MCS}$ are reactive, and still more preferably, capacitive. In the example of FIG. 1A, the measurements are taken in differential mode, so that each measuring device comprises two identical measuring capacitances, but this is not essential.

Each device VM is essentially made up of a conventional frequency changing circuit and an analogue-to-digital converter. The reason is that the voltages at the terminals of the measuring impedances are electrical signals at the carrier frequency f. In order to reduce power consumption and to improve computation precision, it may be beneficial to perform the impedance computation at low frequency. Provision is then made for conversion to a lower frequency in order to be able to perform the computations that follow. It will be noted that in some cases it is possible to set up this measuring circuit by using circuit elements that are present in the radio-frequency reception circuits of the system. This is because if the system operates in transmission mode and in reception mode, the reception part has frequency changing circuits and these circuits can very well be used to take the voltage measurements.

The voltage drop measurement $V_{1S}-V_{2S}$ ($V_{2E}-V_{1E}$) at the terminals of the impedance $Z_{MCS}$ ($Z_{MCE}$) allows the output (input) current of the matching network to be determined. The output (input) voltage of the matching network is measured directly by the device VM.

By computing the ratio and the phase shift between the output current and voltage of the matching network, which are measured by the device $Z_{MCS}$, it is therefore possible to determine a complex impedance $Z_m$ that represents the output impedance of the matching network. Equally, by computing the ratio and the phase shift between the input current and voltage of the matching network, which are measured by the device $Z_{MCS}$, it is possible to determine a complex impedance that represents the input impedance of the matching network, and therefore the load impedance of the radio-frequency device DRF1 (the amplifier, in a transmission chain).

Figure 1B:
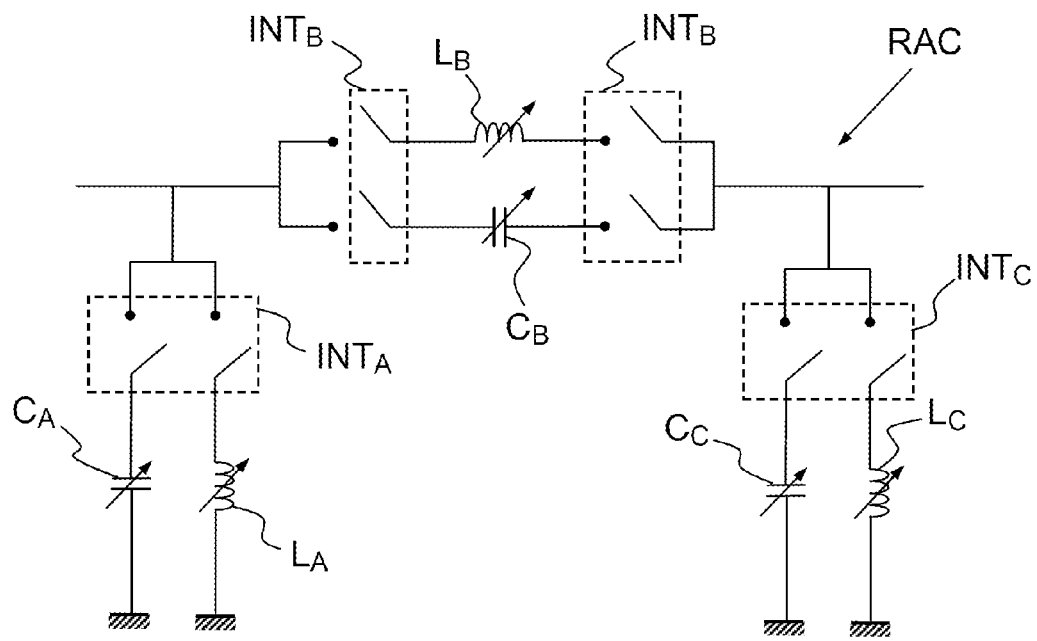
FIG. 1B shows the circuit diagram of the impedance matching network of the module of FIG. 1A.

FIG. 1B shows the diagram for a possible embodiment of the impedance matching network RAC. This network is reconfigurable in two ways: firstly, a set of control switches $INT_A$, $INT_B$, $INT_C$ allows the topology thereof to be modified; secondly, it comprises a set of reactive elements $C_A$, $C_B$, $C_C$, $L_A$, $L_B$, $L_C$, at least some of which (at least one, preferably several) exhibit a variable reactance. In the example of FIG. 1B, which is provided without limitation, the network exhibits a generally "Pi" configuration with a central branch and two lateral branches or legs. According to the configuration of the switches, each of these branches may be capacitive, inductive or constitute a parallel LC circuit; moreover, the legs may be disconnected. Thus, by way of example, it is possible to take action on the switches in order to configure the impedance matching network so that it takes a topology chosen from among the following: Pi topology with capacitive legs and an inductive central branch; Pi topology with inductive legs and a capacitive central branch; simple parallel RC circuit connected in series between the first and second radio-frequency devices.

In the example of FIG. 1B, all of the reactive elements of the impedance matching network exhibit a variable reactance (and therefore inductance or capacitance), but this is not essential.

A first configuration device DC1 controls the switches $INT_A$, $INT_B$, $INT_C$, thus determining the topology of the impedance matching network RAC. A second configuration device DC2 takes action—electrically and/or mechanically—on the reactive elements $C_A$, $C_B$, $C_C$, $L_A$, $L_B$, $L_C$ in order to modify their reactance. These configuration devices are in turn controlled by the data processor PD, indeed its are integrated therein. By way of example, the first configuration device can comprise electronic circuits for controlling the switches $INT_A$, $INT_B$, $INT_C$ and the second configuration device can comprise voltage generators allowing the capacitance of variable-capacitance diodes to be varied and current generators allowing the inductance of reactors having a saturable core to be varied; there are also voltage-controlled inductances, and tunable inductances of microelectromechanical type (MEMS), see for example:

Casha, O.; Grech, I.; Micallef, J.; Gatt, E.; Morche, D.; Viala, B.; Michel, J. P.; Vincent, P.; de Foucauld, E.: "Utilization of MEMS Tunable Inductors in the design of RF voltage-controlled oscillators", 15th IEEE International Conference on Electronics, Circuits and Systems, 2008. ICECS 2008;

L. Collot, J. Lintignat, B. Viala, D. Morche, J-P. Michel, B. Barelaud, B. Jarry "Reconfigurable Filtering Differential Low Noise Amplifier Using MEMS Tunable Inductor" Proceedings of the 40th European Microwave Conference, 2010, pages: 826-829.

The data processor PD is typically a microprocessor programmed in convenient fashion, but it may also be a digital circuit whose configuration is embedded in hardware, or a combination of the two. This processor performs the following operations:
- From the voltage and current measurements taken by the measuring device DME and/or DMS, it determines the input and/or output impedance of the impedance matching network.
- From the input and/or output impedance of the matching network, from the latter (topology and value of the reactances), it determines the impedance value of the device DRF1 or of the device DRF2. Typically, in the case of a radio-frequency transmission or reception chain, it will be a matter of determining the impedance of the antenna—corresponding to DRF2 in a transmission chain and to DRF1 in a reception chain.
- It determines the value that the reactances of the variable elements of the impedance matching network need to take in order to provide impedance matching for the radio-frequency chain. Typically, in a transmission chain, it will be a matter of ensuring that the load impedance of the power amplifier (DRF1) is equal, or as close as possible, to a predefined optimum impedance (generally, the output impedance of said amplifier). Equally, in the case of a reception chain, it will be a matter of ensuring that the input impedance of the low-noise amplifier (DRF2) is equal, or as close as possible, to a predefined optimum impedance (generally, the input impedance of said amplifier). This computation is repeated for every possible topology (or at least for a predefined set of possible topologies) of the network RAC. In this way, a plurality of admissible configurations of the network RAC are obtained, exhibiting different topologies and all allowing impedance matching to be provided.

Among these admissible configurations, it selects the one that exhibits the best power output, and therefore the lowest losses. To that end, it needs to have a characterization of the various reactive elements of the matching network. Then, it controls the configuration devices DC1, DC2 for the matching network accordingly.

Figure 2:
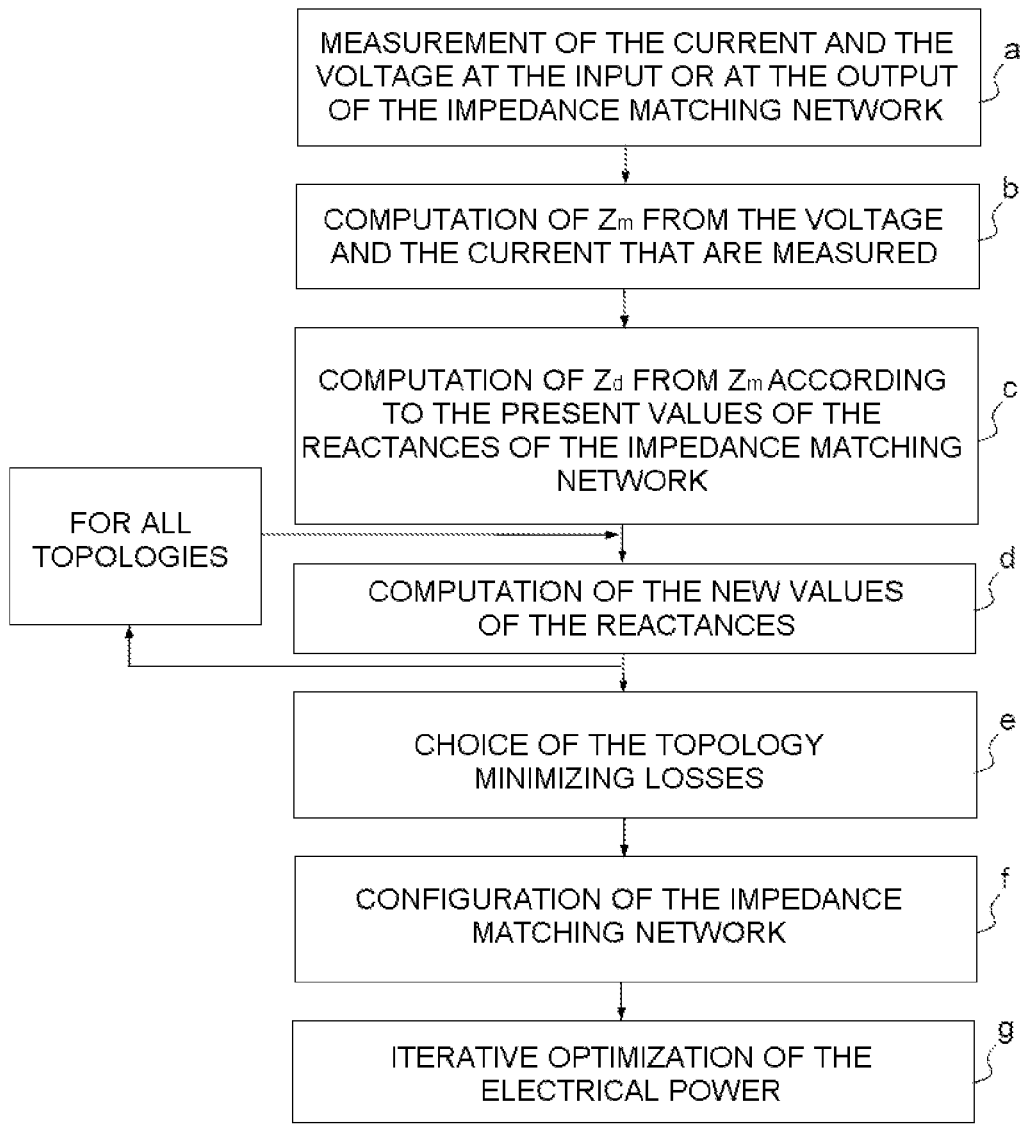
FIG. 2 shows the flowchart for an automatic impedance matching method according to an embodiment of the invention.

These various operations correspond to steps "b", "c", "d" and "e" of the flowchart in FIG. 2. Step "a" corresponds to the measuring operations, performed by the device DME and/or DMS, while step "f" corresponds to the configuration of the network RAC by the devices DC1 and DC2.

Step "g" is optional. It involves iteratively adjusting the impedance values—using the configuration device DC2 controlled by the processor PD—so as to optimize the electrical power at the output of the matching network, or even the electrical power measured at another point in the radio-frequency chain. The idea on which this step is based is that sometimes it may be advantageous to accept a slight impedance mismatch if it is accompanied by a significant reduction in the losses introduced by the matching network.

Figure 3:
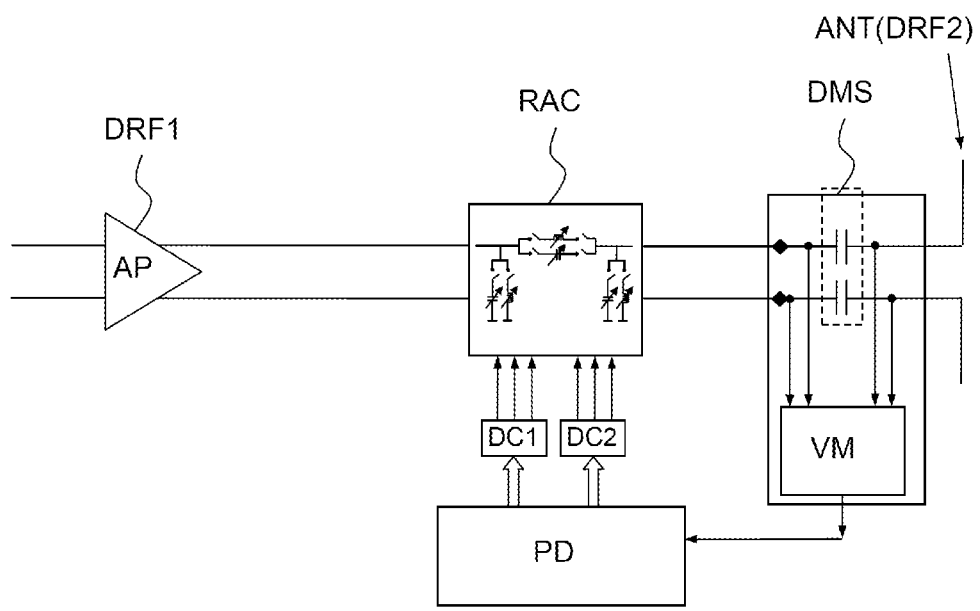
FIGS. 3 and 4 show the block diagrams of a radio-frequency transmission chain and a radio-frequency reception chain, respectively, according to respective embodiments of the invention.

In the case of a transmission chain, it is relevant to maximize the power at the output of the matching network, which is provided for the antenna ANT; this power can be computed from the output current and voltage of the network RAC, which are measured by the device DMS. The use of a measuring device at the input, DME, is not necessary (FIG. 3).

Figure 4:
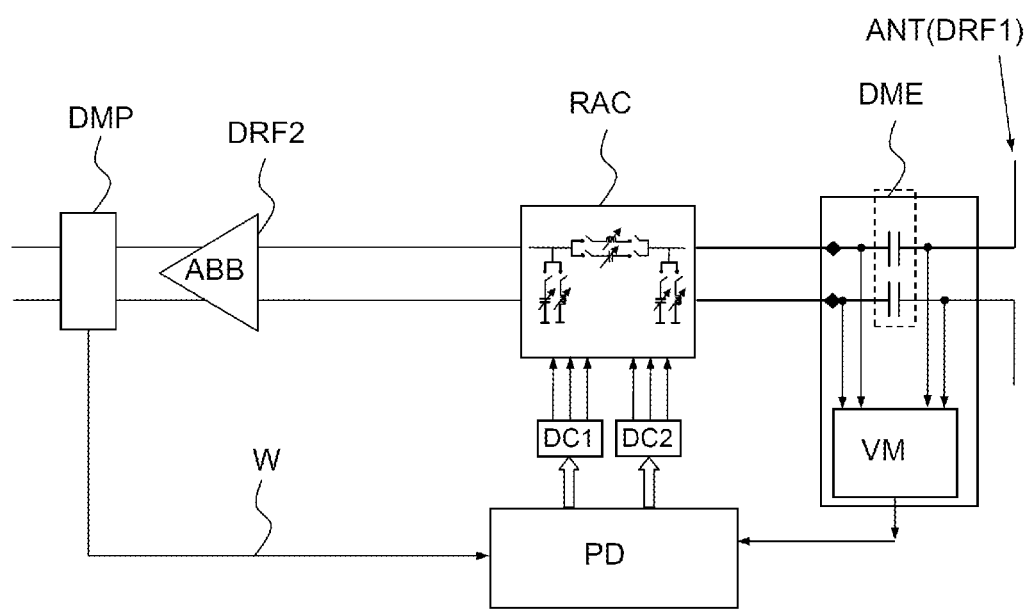

In the case of a reception chain, on the other hand, it is preferable to maximize the power W at the output of the low-noise amplifier ABB, which requires a dedicated measuring device DMP, which may have a structure similar to that of DMS and DME. This setup is illustrated in FIG. 4. In the example illustrated in this figure, moreover, the measuring device DME is present, but DMS is absent; the opposite would also have been possible.

The use of a power measuring device that is distinct from the measuring device(s) used to provide the impedance matching is also possible in the case of a transmission chain. This is particularly advantageous if there is a desire to take the current and voltage measurements that are used for the automatic impedance matching at the input of the matching network rather than at the output thereof.

It is worth noting that step "g" can also be implemented when the impedance matching network exhibits a fixed topology (in which case step "d" is executed a single time and step "e" has no raison d'être). In relation to the method described in the aforementioned document US 2009/0130991, the convergence is more rapid because the iterative optimization starts an impedance matching situation, which is already close to the optimum case.

In what follows, the implementation of steps "b" to "e" and "g" will be described in more detail with reference to the specific case illustrated in FIG. 3, namely a transmission chain with measurement of the current and voltage at the output of the impedance matching circuit. Generation for cases other than that of a reception chain does not pose any particular difficulty.

Step "b": Computation of the Present Load Impedance.

The measuring circuit DMS receives the voltage signals $V_{1S}$ and $V_{2S}$ defined above. These voltages are at the carrier frequency f; they are preferably downconverted to an intermediate frequency or to baseband by conventional frequency changing circuits using a local oscillator and mixers. The voltage levels $V_{1S}$ and $V_{2S}$, which have been downconverted to this intermediate frequency or to baseband, are then used to compute the vectorial current i that is driven through the measuring impedance $Z_{MCS}$ and therefore the complex impedance $V_{1S}/i$ seen by the amplifier. The phase shifts are preserved in the frequency change.

The modulus of i is the ratio of the modulus of $V_{1S}$ and the modulus of the impedance $Z_{DMS}$; the phase shift of i in relation to the voltage $V_{1S}$ is an angle θ that represents the argument of the impedance $Z_m$. This angle can be determined from the phase shift between $V_{1S}$ and $V_{2S}$, from which π/2 is subtracted, knowing that the phase shift between i and $(V_{1S}-V_{2S})$ is π/2 since, in the embodiment of FIG. 1, $Z_{MCS}$ is a capacitive impedance: $Z_{MCS}=1/(j\omega C_{MCS})$, where "j" is the imaginary unit, ω is the frequency of the radio-frequency signal and $C_{MCS}$ is the capacitance of the capacitor that constitutes the measuring impedance.

The phase shift between $V_{1S}$ and $V_{2S}$ can be computed, by way of example, by multiplying the analogue signals $V_{1S}$ and $V_{2S}$, which have been downconverted to baseband, and by observing the periodic variation of the product of the two signals. This product fluctuates between a positive maximum value and a negative minimum value. The algebraic sum of these two values is proportional to the cosine of the phase shift and the proportionality coefficient is the algebraic difference between these two values. Therefore, by relating the sum of the two values and the difference between the two values, the cosine of the phase shift is found, from which the phase shift between $V_{1S}$ and $V_{2S}$ is taken, from which the phase shift between $V_{1S}$ and i is deduced. Other methods of digital computation of the phase shift can be used, for example through digitization of the two signals $V_{1S}$ and $V_{2S}$ on one bit, which is equal to 1 when the signal is positive and to 0 when it is negative. The time difference in the pulse trains of 1 bits resulting from digitization of $V_{1S}$, in relation to the same pulse trains corresponding to the digitization of $V_{2S}$, represents the phase shift between $V_{1S}$ and $V_{2S}$. The sign of the phase shift is spotted by observing the rising edges of the signals that have thus been digitized on one bit; this can be accomplished by a flip-flop D that receives one of the voltages $V_{1S}$ and $V_{2S}$ at a signal input and the other of these voltages at a clock input, and that transfers to its output the state of the signal input at the moment of a rising edge at the clock input.

Once the argument θ of the impedance $Z_m$ has been obtained, it is a simple matter to compute its real part and its imaginary part.

Step "c": Computation of the Present Impedance of the Antenna.

From this measurement of $Z_m$, knowing the configuration of the matching network (topology and present digital values of the capacitances and inductances), and also the digital value of the measuring capacitance $Z_{DMS}$, it is possible to compute the impedance of the antenna.

This computation is immediate, because one simply has: $Z_{ant}=Z_{DMS}-Z_{MCS}$.

Step "d": Computation of Modified Values for the Reactances of the Matching Network.

Knowing both the present impedance of the antenna $Z_{ant}$ and the equivalent impedance of the matching network Zeq, which is dependent on $(C_A, C_C, L_B)$, and the measuring impedance $Z_{MCS}$, it is required to compute the values $C_A$, $C_C$, $L_B$ with which the variable elements need to be provided in order for the impedance of the set $Z_{DME}$, as will be seen in the terminals of the amplifier (and therefore at the input of the matching network), to be equal to the nominal value $Z_{opt}$ (generally, the output impedance of the amplifier): $Z_{DME} = Z_{opt}$.

To accomplish this, it is possible to resort to techniques that are well known to a person skilled in the art, for example based on the use of a Smith chart. The aforementioned document EP 2 037 576 provides an example of application of such a method. In contrast to the case studied in this document, however, the present invention involves the dimensioning of the matching network RAC being repeated a plurality of times by considering different possible topologies. In the case of the configurable network of FIG. 1B, for example, two distinct topologies can be taken into account: a "Pi" topology with an inductive central branch and capacitive legs (this is the topology used for measuring $Z_m$), and a similarly "Pi" topology but with a capacitive central branch and inductive legs.

Step "e": Computation of the Power Output (or, Equivalently, of Losses).

Figure 5:
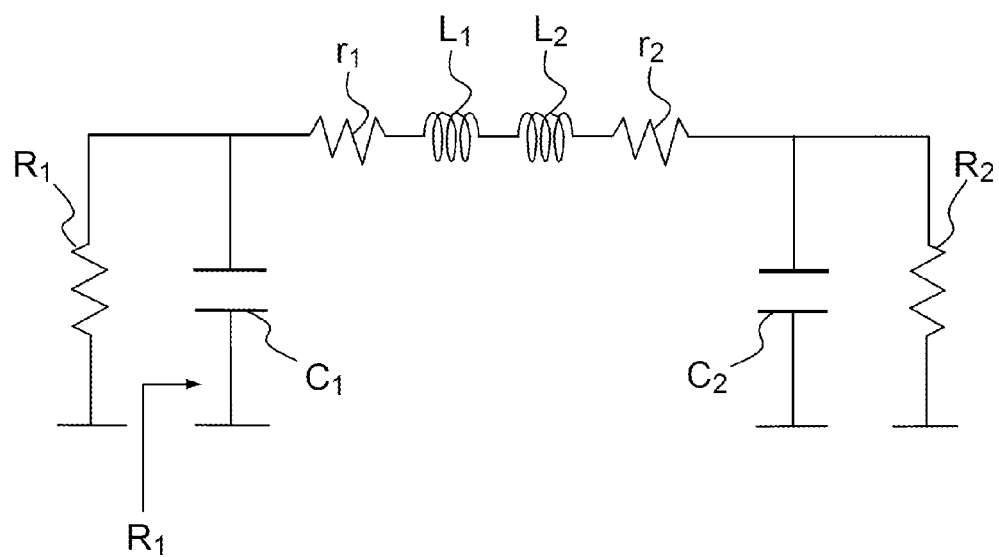
FIG. 5 shows the equivalent circuit diagram of a "Pi" impedance matching network, which is used to compute its power output.

FIG. 5 shows an equivalent diagram of the impedance matching circuit of FIG. 1B in its "Pi" configuration with an inductive central branch and capacitive legs, said circuit being placed in the radio-frequency chain of FIG. 3. The equivalent resistance $R_1$ represents the combined effect of the output impedance of the power amplifier PA, which impedance is assumed to be known and purely resistive, and the parasitic resistance of the capacitance $C_A$; in this particular case, $C_1$ is equal to $C_A$. The equivalent resistance $R_2$ represents the combined effect of the input impedance of the antenna $Z_{ant}$, which impedance is measured in step "c" and considered to be purely resistive, and the parasitic resistance of the capacitances $C_B$ and $Z_{DMS}$; $C_2$ is an equivalent capacitance accounting for the capacitive effects due to $C_B$ and $Z_{DMS}$. The inductive element $L_B$ is split into two parts $L_1$ and $L_2$ for reasons of computational convenience, with $L_1 + L_2 = L_B$. The same applies for its parasitic resistance $r_L = r_1 + r_2$.

At this point, it is possible to define the quality factors $Q_{C1}$, $Q_{C2}$, $Q_{L1}$, $Q_{L2}$ of the equivalent elements $C_1$, $C_2$, $L_1$ and $L_2$:

$$Q_{C1} = \omega R_1 C_1$$
$$Q_{C2} = \omega R_2 C_2$$
$$Q_{L1} = \frac{\omega L_1}{r_1}$$
$$Q_{L2} = \frac{\omega L_2}{r_2}$$

The power output $\eta$ is then given by $$\eta = \frac{1}{1 + \left[\frac{Q_{C1}}{Q_{L1}} + \frac{Q_{C2}}{Q_{L2}}\right]}$$

It is possible to verify that the value of $\eta$ is not dependent on the way in which $L_B = L_1 + L_2$ is broken down.

It is noted that the output $\eta$ is dependent on the value of $C_1$, $C_2$, $L_1$ and $L_2$ and therefore on $C_A$, $L_B$ and $C_C$, thus, it varies when the reactance value of the elements of the matching network RAC is adjusted in order to provide impedance matching. Furthermore, the value of the parasitic resistances can also vary during this adjustment.

A general method for computing output, which can be applied to any topology, is set out in detail in the article by Yehui Han and David J. Perreault "Analysis and Design of High Efficiency Matching Networks", IEEE Transactions on Power Electronics, Vol. 21, No. 5, September 2006, pages 1484-1491.

It is therefore possible to compute the value of the output $\eta$ for all configurations of the network RAC that are determined in step "d", and then to choose the one that exhibits the highest output value.

Step "g": Iterative Optimization of the Power at the Output of the Matching Network.

This last step, which is optional, consists in iteratively varying the reactances of the network RAC around values that are determined in step "d", without modifying the topology of the network that was chosen following step "f", the aim being to maximize the power transmitted to the antenna and measured using the device DMS. In contrast to the previous steps, the optimization is performed by taking action on the real circuit and by measuring the effectively transmitted power, rather than on the basis of computations using a model of the circuit. This iterative optimization makes it possible to take account of the fact that a slight impedance mismatch may be more than compensated for by a reduction in the level of losses in the matching circuit. It also makes it possible to correct the imprecisions that are inherent in the models used for determining the configuration providing the impedance matching.

This step can be implemented as explained in the aforementioned document US 2009/0130991. However, as the iterative algorithm is initialized by an impedance matching configuration—which is therefore close to the optimum case—its convergence is rapid.

The invention has been described with reference to a particular embodiment but it is not limited thereto. By way of example, the first and second radio-frequency devices may not be an antenna and a power amplifier or low-noise amplifier; it is moreover not essential for the radio-frequency chain to be a transmission or reception chain. Additionally, the impedance matching network may exhibit not a "Pi" topology but rather, by way of example, a "Tee" topology or a topology of a more complex type. Furthermore, the optimization of the configuration of the matching network taking into account both the impedance matching and losses can be carried out in a manner other than using the method of FIG. 2; one alternative may consist in testing a plurality of configurations—which are defined by a topology and a set of reactance values of the reactive elements of the network—sampling the space of the configurations, and then in choosing the optimum configuration, that is to say maximizing at least one performance criterion such as the power transferred through the matching network.

The invention claimed is:

1. An automatic impedance matching module that is intended to be arranged between a first radio-frequency device and a second radio-frequency device, said module comprising:
an impedance matching network having an input that is intended to be connected to said first radio-frequency device and an output that is intended to be connected to said second radio-frequency device, said impedance matching network comprising a plurality of reactive elements, at least one of which exhibits a variable reactance;

a current and voltage measuring device, which is designed to measure a current and a voltage at the input or at the output of said impedance matching network;

at least one first configuration device for said impedance matching network, which is capable of modifying the reactance of said or of each said reactive element exhibiting a variable reactance; and a data processor that is configured to receive, as input, current and voltage measurements from said measuring device and to provide, as output, control signals for said at least one first configuration device; wherein:

said impedance matching network exhibits a reconfigurable topology;

the module also comprises at least one second configuration device for said impedance matching network, which is capable of modifying its topology;

said data processor is configured to:

i determine a complex impedance Zm by calculating a ratio and a phase shift between the voltage and the current that are measured by said measuring device, said complex impedance representing a load impedance of said first radio-frequency device or an input impedance of said second radio-frequency device, depending on whether said measuring device is designed to take measurements at the input or at the output of said impedance matching network;

ii from said complex impedance Zm, from the topology and from known current values of the reactive elements of said impedance matching network, calculating the value of a complex impedance Zd that is representative of an output impedance of said first radio-frequency device or of an input impedance of said second radio-frequency device, depending on whether said measuring device is designed to take measurements at the input or at the output of said impedance matching network;

iii for a plurality of possible topologies of said impedance matching network, calculating new reactance values for said at least one reactive element exhibiting a variable reactance, said calculating being performed, for each said topology, so that said load impedance of said first radio-frequency device or said input impedance of said second radio-frequency device takes a value as close as possible to a predefined nominal value;

iv choosing, from among said topologies of said impedance matching network, the one that minimizes power losses that are caused within the matching network by resistive components of the impedances of said reactive elements, when the reactance of said at least one reactive element exhibiting a variable reactance takes the calculated value of the complex impedance Zd; and v generating control signals for said first and second configuration devices that are adapted so that said devices configure the impedance matching network so that it takes the chosen topology and so that said at least one reactive element exhibiting a variable reactance takes the calculated value of the complex impedance Zd.

2. The automatic impedance matching module of claim 1, wherein said data processor is also configured to receive, as input, an electrical power measurement, or data allowing an electrical power to be calculated, and to generate control signals for said first configuration device(s) that are adapted so that said devices iteratively adjust the reactance of said or of each said reactive element exhibiting a variable reactance so as to maximize said electrical power.

3. The automatic impedance matching module of claim 2, wherein said data processor is configured to calculate said electrical power from the current and voltage measurements from said measuring device.

4. The automatic impedance matching module of claim 2, also comprising a power measuring device that is designed to measure an output electrical power from said second radio-frequency device and to provide a measurement result for said data processor.

5. A radio-frequency transmission chain comprising a power amplifier, an antenna and an automatic impedance matching module according to claim 1 that is connected between an output of said power amplifier and an input port of said antenna.

6. A radio-frequency reception chain comprising an antenna, a low-noise amplifier and an automatic impedance matching module according to claim 1 that is connected between an output port of said antenna and an input of said low-noise amplifier.

* * * * *